(12) United States Patent
Sakuma et al.

(10) Patent No.: US 7,435,506 B2
(45) Date of Patent: Oct. 14, 2008

(54) BATTERY PACK

(75) Inventors: Kazuhiko Sakuma, Fukushima (JP); Chiaki Anzai, Fukushima (JP)

(73) Assignee: Sony Corporation, Tokyo (JP)

( * ) Notice: Subject to any disclaimer, the term of this patent is extended or adjusted under 35 U.S.C. 154(b) by 640 days.

(21) Appl. No.: 11/194,366

(22) Filed: Aug. 1, 2005

(65) Prior Publication Data

US 2005/0258804 A1 Nov. 24, 2005

Related U.S. Application Data

(62) Division of application No. 10/313,837, filed on Dec. 6, 2002, now Pat. No. 7,318,978.

(30) Foreign Application Priority Data

Dec. 7, 2001 (JP) ............................. 2001-374039
Dec. 7, 2001 (JP) ............................. 2001-374086

(51) Int. Cl.
*H01M 2/10* (2006.01)
*H01M 10/42* (2006.01)

(52) U.S. Cl. ............................. 429/61; 429/7; 429/121; 429/326; 320/112

(58) Field of Classification Search ................. None
See application file for complete search history.

(56) References Cited

U.S. PATENT DOCUMENTS

| 6,492,058 | B1 * | 12/2002 | Watanabe et al. | 429/121 |
| 6,808,844 | B2 * | 10/2004 | Ehara | 429/175 |
| 2003/0108786 | A1 * | 6/2003 | Aaltonen et al. | 429/61 |

* cited by examiner

*Primary Examiner*—John S Maples
(74) *Attorney, Agent, or Firm*—Sonnenschein Nath & Rosenthal LLP

(57) ABSTRACT

There is disclosed a battery pack, which has a plate-shaped resin-formed body to divide an internal space of the battery pack into at least two spaces in a thickness direction thereof, so that a battery is received in a first internal space, while a wiring substrate having a control circuit packaged thereon is placed in a second internal space, thereby allowing the battery pack to hold an input/output circuit or the like of a memory card securely in a limited space in the battery pack, while ensuring that a sufficient insulation is provided to the battery, when the battery pack is used for PDA'S, for instance.

7 Claims, 9 Drawing Sheets

BATTERY PACK

CROSS REFERENCES TO RELATED APPLICATIONS

The present application is a divisional of U.S. Ser. No. 10/313,837, filed Dec. 6, 2002, now U.S. Pat. No. 7,318,978, and claims the benefit of and priority to Japanese Priority Documents JP 2001-374039 and JP 2001-374086, both filed in the Japanese Patent Office on Dec. 7, 2001. The contents of all these applications are incorporated herein by reference to the extent permitted by law.

BACKGROUND OF THE INVENTION

1. Field of the Invention

This invention relates to a battery pack, which may be used for PDAs (Personal Digital Assistants), for instance. More specifically, the present invention relates to a battery pack having a plate-shaped resin-formed body for dividing an internal space of the battery pack into two spaces in a thickness direction so that a battery is received in one internal space, and a wiring substrate having a control circuit mounted thereon is placed in the other internal space, thereby providing the battery pack, which may securely hold an input/output circuit or the like for a memory card in a limited space in the battery pack, while ensuring that a sufficient insulation is provided to the battery. In addition, the present invention also relates to a battery pack having, along the battery, a first wiring substrate having electronic components surface-mounted on a battery side-face thereof and a second wiring substrate having electronic components surface-mounted on the opposite face to the battery side-face of the first wiring substrate while having no surface-mounted electronic component on a battery side-face thereof, thereby providing the battery pack, which may minimize an increase of a thickness thereof so as to serve also as an interface such as an interface for IC cards.

2. Description of the Related Art

Personal mobile information terminals conventionally have been used to enable mobile viewing of various pieces of information stored in a computer. Thus, the personal mobile information terminals have been downsized enough to be conveniently portable for a user and are recently designed to be thinner so as to be storable in a breast pocket or the like.

For this reason, a recent downsized mobile information terminal has a replaceable battery pack that provides a driving force thereof. The battery pack is replaced with another one at need to prevent the information mobile terminal from becoming inoperable due to a dead battery. In addition, the battery pack is also designed to be thinner in order not to lose a portability of the mobile information terminal connected therewith.

Some of the downsized mobile information terminals as described above are connectable with various information apparatuses, and as a result, may provide an increased number of mobile applications by a use thereof, thereby further increasing usability thereof.

A downsizing of this kind of mobile information terminal, however, involves a disadvantage of a limitation on a space, in which interfaces connectable with various apparatuses are received, resulting in a limited number of apparatuses connectable with this kind of mobile information terminal.

One of approaches for eliminating the above disadvantage is to allow the battery pack to serve also as this kind of interface. This approach is supposed to provide this kind of mobile information terminal with an increased number of connections to various apparatuses as compared with a case of conventional approaches.

Specifically, assume that the battery pack of the mobile information terminal is designed to be connectable with a small-sized memory card so that the memory card connected to the battery pack may be accessed for personal information or the like, for instance. When the battery pack is attached to the mobile information terminal, a side face or the like of the battery pack is exposed to the outside. To provide a connection with the memory card, an opening for inserting the memory card is provided in a side face of the battery pack, and an input/output circuit for connecting the memory card with the mobile information terminal is also provided in the battery pack, thereby allowing the memory card to be available through the battery pack. An IC card having a shape of a credit card can also be used in place of the above memory card.

In this kind of connection for using the battery pack as an interface to the memory card or the IC card, however, this kind of battery pack is required to securely hold the input/output circuit or the like as described above in a limited space of the battery pack while ensuring that a sufficient insulation is provided to a secondary battery. Furthermore, due to a demand for the thinner mobile information terminal as described above, it is also necessary for the battery pack to minimize an increase of a thickness thereof, even when the battery pack is designed to serve also as the interface for the IC card and the like.

SUMMARY OF THE INVENTION

Under the above circumstances, there is a need for a battery pack, which may hold an input/output circuit or the like for a memory card securely in a limited space in the battery pack while ensuring that a sufficient insulation is provided to a battery. In addition, there is also a need for a battery pack, which may minimize an increase of a thickness thereof so as to serve also as an interface such as an interface for an IC card and the like.

According to an aspect of the present invention, there is provided a battery pack which comprises a sheet-shaped resin-formed body positioned and held in place on an inner wall surface of an exterior housing to divide an internal space defined by the exterior housing into at least two spaces in a thickness direction thereof, and a battery received in a first internal space provided by the resin-formed body to output a power, and a wiring substrate held in place by the resin-formed body on a side of a second internal space provided by the resin-formed body and having a control circuit mounted thereon to control a supply of the power from the battery.

The above configuration of the battery pack according to the present invention provides the sheet-shaped resin-formed body insulating the battery and the wiring substrate from each other and also positioning and holding the wiring substrate in place. This allows the wiring substrate held in place by the resin-formed body as described above to have a sufficient mounting space, so that various interfaces may be mounted on the wiring substrate when the wiring substrate is applied to other various uses.

In addition, the internal space of the battery pack is divided into at least two spaces through the plate-shaped resin-formed body in a thickness direction thereof so that the battery is received in the first internal space, while the wiring substrate having the control circuit mounted thereon is placed in the second internal space. This allows the wiring substrate to hold the input/output circuit or the like for the memory card securely in a limited space in the battery pack, while ensuring sufficient insulation between the battery and the circuit. In addition, by mounting the input/output circuit for connection to/from the external apparatus on the wiring substrate of the present invention, an interface corresponding to the input/output circuit can be provided to the battery pack. Specifically, by mounting a memory card input/output circuit on the substrate of the battery pack and providing an opening in the exterior housing thereof, it becomes possible to provide an interface for the memory card in the limited space of the battery pack, while ensuring that the sufficient insulation is provided to the battery.

In addition, a non-aqueous secondary battery is used as the secondary battery to be received in the battery pack of the present invention, and a charge/discharge control circuit mounted on the wiring substrate serves to not only control the supply of the power but also control a charging, thereby increasing a reliability of this kind of battery pack.

In addition, a relay wiring substrate having at least a terminal for outputting the power is also provided to be in close contact with a wall surface of a lower casing of the exterior housing such that the terminal is exposed to the outside of the exterior housing. Further, a relay wiring substrate is connected to the wiring substrate through a flexible wiring substrate formed of a flexible sheet-shaped wiring material to output the power of the secondary battery through the wiring substrate, a metal-made wiring material and the relay wiring substrate in this order, thereby providing a simple operation to assemble the battery pack of the present invention, also allowing the battery pack of the present invention to have a reduction of a wiring material-related output loss when the power is supplied, and also allowing the overall configuration of the battery pack of the present invention to be simplified so as to ensure that these components may be placed in the limited space thereof.

In addition, the exterior housing is composed of an upper casing and a lower casing, and the lower casing and the resin-formed body define the first internal space, while the upper casing and the resin-formed body define the second internal space, thereby providing a simple configuration to securely hold the resin-formed body by using the upper casing and the lower casing for preventing the resin-formed body from being dislocated in the thickness direction thereof.

According to another aspect of the present invention, there is provided a battery pack, in which the resin-formed body holds, along the battery, a first wiring substrate having electronic components surface-mounted on a battery side-face thereof and a second wiring substrate having electronic components surface-mounted on an opposite face to the battery side-face of the first wiring substrate while having no surface-mounted electronic component on a battery side-face thereof, and the electronic components surface-mounted on the first wiring substrate includes a control circuit for controlling a supply of the power from the battery.

The above configuration of the battery pack according to another aspect of the present invention provides the resin-formed body, which holds, along the battery, the first wiring substrate having the electronic components surface-mounted on the battery side-face thereof and the second wiring substrate having the electronic components surface-mounted on the opposite face to the battery side-face of the first wiring substrate while having no surface-mounted electronic component on the battery side-face thereof. This allows the first wiring substrate to hold the mounted components so as to be in the vicinity of the battery and thus also allows these electronic components to have an increased thermal coupling with the battery. In addition, this also allows the first wiring substrate to appropriately select a mounted component to be mounted thereon so that, even when the mounted component is held in close contact with the battery, the first wiring substrate may ensure a sufficient spatial distance corresponding to the mounted component by adjusting a soldering position or the like thereon, to which the mounted component is soldered. On the other hand, the second wiring substrate may be held in extremely close contact with the battery. This allows the electronic components surface-mounted on the first wiring substrate to serve as the control circuit for controlling the power of the battery, thereby increasing a battery temperature-based power control and also ensuring a safety of the battery pack enabled by the above sufficient spatial distance. On the other hand, the second wiring substrate has the input/output circuit for the IC card or the like, which has relatively few safety requirements as compared with the control circuit. This allows the second wiring substrate to utilize a sufficient space along the battery such that the space may receive the input/output circuit or the like, thereby providing a minimized increase of a thickness of the second wiring substrate. As a result, the battery pack of the present invention may have a minimized increase of the entire thickness thereof, thereby serving also as the interface such as the interface for the IC card.

In addition, the first and second wiring substrates may be connected together to allow a connector, whose function is to be a mediator for an output of the power, to be additionally used for a connection between the second wiring substrate and the mobile information terminal, thereby allowing the entire configuration of the battery pack of the present invention to be simplified.

In addition, the connection of the second wiring substrate to the mobile information terminal through the first wiring substrate also allows the battery pack of the present invention to have simplified internal connections.

The spacer serving as the injection-molded body has the openings on portions thereon which correspond to the electronic components mounted on the second wiring substrate, thereby allowing the battery pack of the present invention to have a proportional reduction of the entire thickness thereof.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENTS

A configuration of a battery pack according to a first embodiment of the present invention will now be described.

Figure 2:
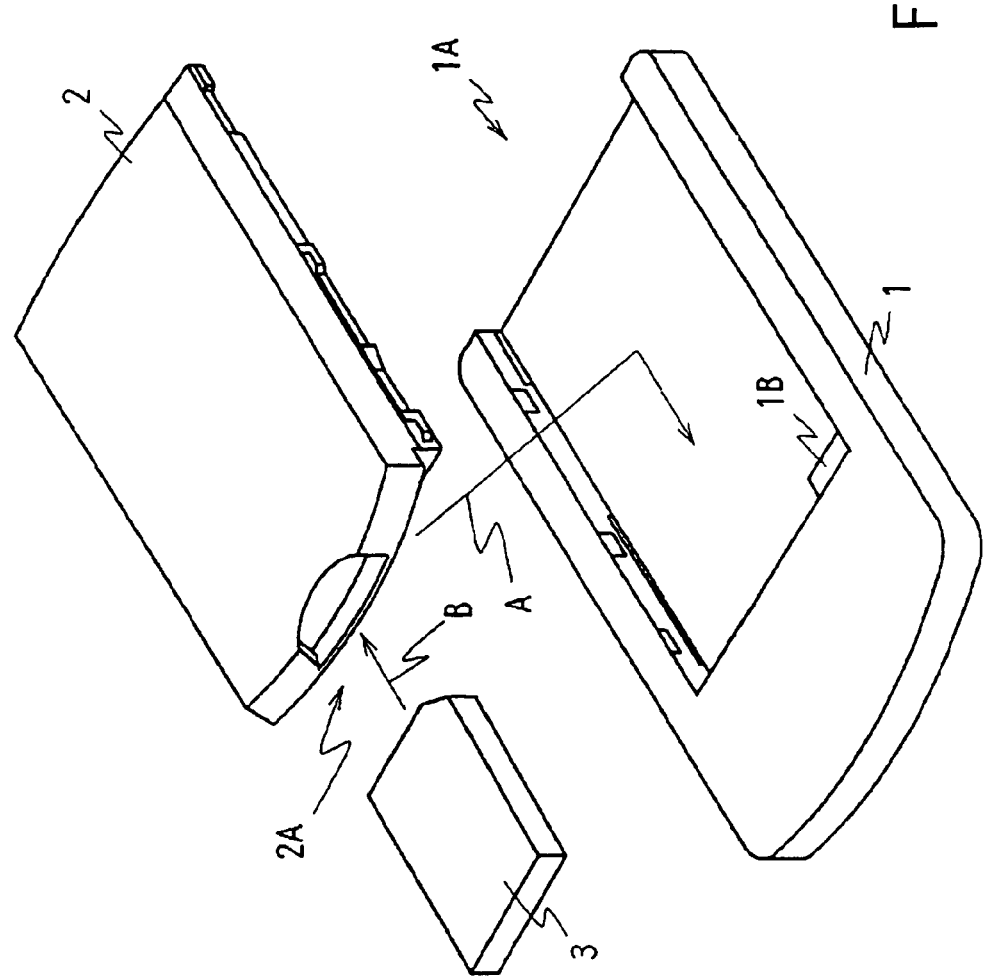
FIG. 2 is a perspective view showing the battery pack together with a mobile information terminal according to the first embodiment of the present invention.

FIG. 2 is a perspective view of a mobile information terminal 1 according to the first embodiment of the present invention as seen from a back face side thereof. The mobile information terminal 1 is a PDA (personal digital assistant), which has, on a surface thereof, a liquid crystal display panel, and which also has, on the surface or the like thereof, various operators and an interface. These operators and interface allow the mobile information terminal 1 to be connected to a personal computer or the like, for instance, so as to upload information stored in the personal computer for viewing or to allow the mobile information terminal 1 to download various pieces of information stored therein to the personal computer.

The mobile information terminal 1 has, on a back face thereof, a recess section 1A for receiving a battery pack 2 detachably. The recess section 1A has, on a starting end part thereof, a connector 1B for receiving a power or the like of the battery pack 2. In addition, the recess section 1A also has, on side faces thereof, fixing pieces or the like for receiving and fixing the battery pack 2. This allows the mobile information terminal 1 to receive the battery pack 2 by sliding the battery pack 2 along the recess section 1A as shown by an arrow A in FIG. 2, thereby providing a driving power from the power supply of the battery pack 2 to the mobile information terminal 1. Alternatively, the battery pack 2 may be detached from the mobile information terminal 1 by sliding the battery pack 2 in the reverse direction.

The mobile information terminal 1 is also designed to receive a small-sized memory card 3 through the battery pack 2. For this reason, the mobile information terminal 1 is also designed such that various terminals such as a power supply terminal and terminals required for an access to the memory card 3 through the battery pack 2 are placed on the connector 1B.

In addition, the battery pack 2 is also designed to protrude from the back face of the mobile information terminal 1 while covering the recess section 1A when the battery pack 2 is received in the mobile information terminal 1. The battery pack 2 also has, on a side face thereof that corresponds to an upper end of the mobile information terminal 1, an opening 2A for inserting the memory card 3. The battery pack 2 also has, on an interior part of the opening 2A thereof, components such as a terminal for receiving the memory card 3 and an input/output circuit connected to the above terminal. This allows the mobile information terminal 1 to provide an access to the memory card 3 through the battery pack 2 when the memory card 3 is inserted into the opening 2A of the battery pack 2 as shown by an arrow B in FIG. 2 after the battery pack 2 is attached to the mobile information terminal 1.

Figure 1:
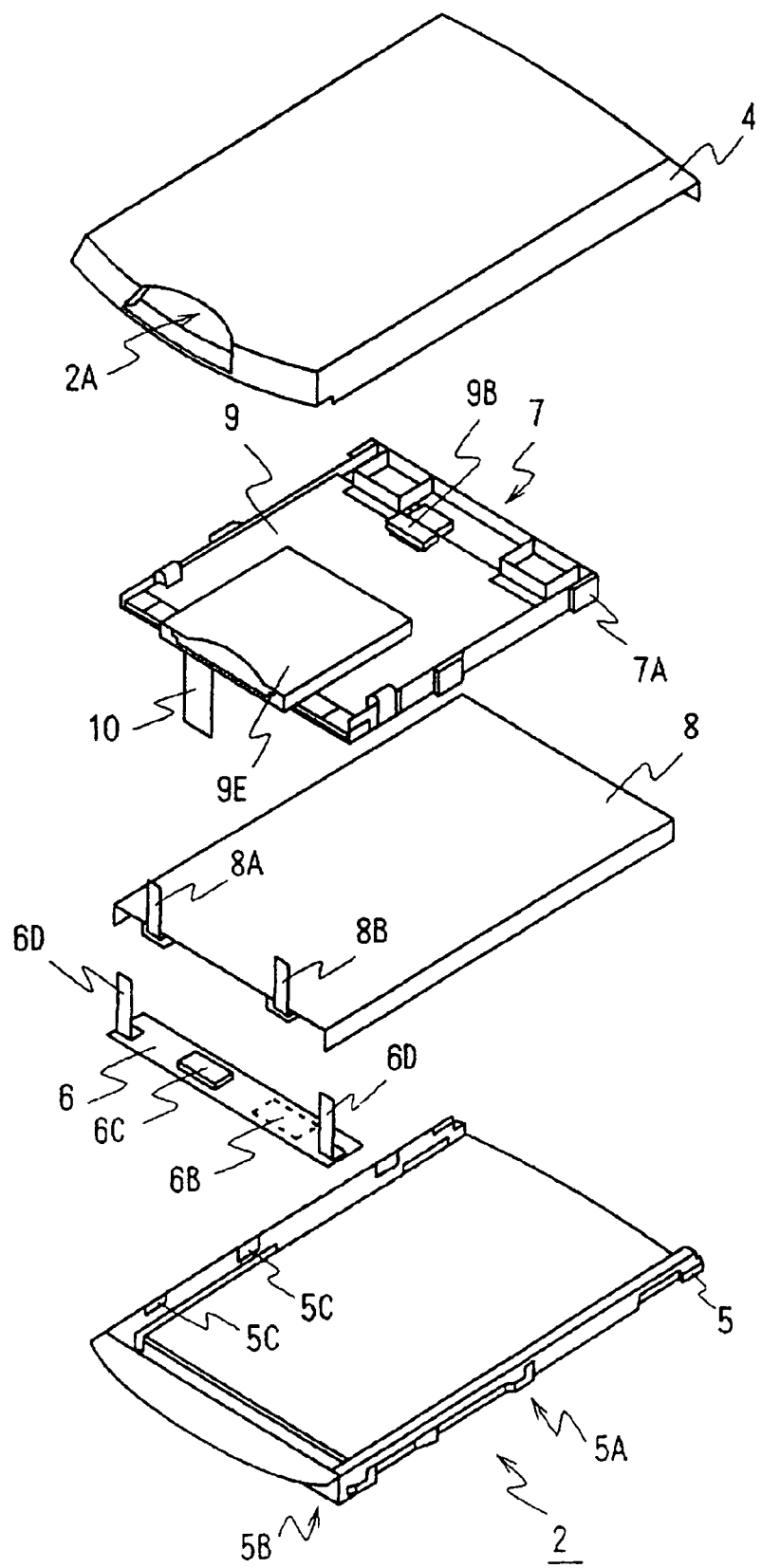
FIG. 1 is an exploded perspective view showing a battery pack according to a first embodiment of the present invention.

FIG. 1 is an exploded perspective view of the battery pack 2. The battery pack 2 is formed to have a thin plate shape and is entirely covered with an exterior housing composed of an upper casing 4 and a lower casing 5.

The lower casing 5 is formed by subjecting a resin material to an injection molding into a substantially rectangular shape whose opposite longer edges and one shorter edge define wall surfaces. The opposite longer edges of the lower casing 5 have, on outer faces thereof, projections 5A that engage with the fixing pieces provided on the recess section 1A of the mobile information terminal 1, thereby allowing the lower casing 5 to be attached to the mobile information terminal 1.

In addition, the lower casing 5 also has, on a portion thereof that corresponds to the connector 1B of the mobile information terminal 1, a rectangular-shaped opening 5B. A wiring substrate 6 is placed in close contact with an inner wall surface of the lower casing 5 so as to cover the opening 5B from the inner side so that the wiring substrate may extend along the shorter edge of the lower casing 5.

The wiring substrate 6 used herein has, on a portion exposed to the outside through the opening 5B, an electrode 6B that corresponds to the connector 1B. The electrode 6B is designed to serve as a mediator for the battery pack 2, which provides a power supply to the mobile information terminal 1 and which may be connected to a charger in order to provide a power input for charging to the mobile information terminal 1. In addition, the electrode 6B is also designed to be a mediator for transmission and reception of input/output data between the memory card 3 and the mobile information terminal 1. For this reason, an inner face of the wiring substrate 6 is designed to serve as a component-mounting face relating to a surface mounting. The component-mounting face of the wiring substrate 6 is provided with a Zener diode or the like for reducing a surge voltage that is produced around the electrode 6B to be engaged with the memory card 3. The component-mounting face of the wiring substrate 6 is also provided with a connector 6C for guiding a connection of the electrode 6B to be engaged with the memory card 3 to an input/output circuit, which will be described later. The component-mounting face of the wiring substrate 6 is also provided with terminals 6D for providing input/output of a power between the secondary battery and the mobile information terminal 1.

Among the above components mounted on the wiring substrate 6, the terminals 6D are provided on both ends of the wiring substrate 6 in a longitudinal direction with a sufficient interval therebetween. In addition, the terminals 6D are formed by subjecting a predetermined metal plate to a machining, and are also soldered to the wiring substrate 6 so that tip ends of the terminals 6D extend toward the upper casing 4, thereby providing a sufficient reduction of a power loss. On the other hand, the connector 6C is placed on a substantially middle position of the wiring substrate 6 in the longitudinal direction and is provided as a connector for a flexible wiring substrate 10 formed of a flexible sheet-shaped wiring material. This allows the battery pack 2 to use the flexible wiring substrate 10 for an inner wiring structure for the memory card 3, thereby providing a proportional downsizing to the battery pack 2.

In addition, the lower casing 5 also has, on an inner wall surface of the longer edge, recess sections 5C by which a spacer 7 is positioned and held in place. The spacer 7 used herein is a plate-shaped resin-formed body, which is positioned by the recess sections 5C so as to be held in place on the inner wall surface of the exterior housing composed of the upper casing 4 and the lower casing 5 and divides an internal space defined by the exterior housing into two spaces in a thickness direction thereof. In other words, the spacer 7 has, on an outer wall surface thereof, projecting sections 7A so as to correspond to the recess sections 5C of the lower casing 5, and is placed on the lower casing 5 such that the recess sections 5C engage with the projecting sections 7A so as to prevent the battery pack 2 from being dislocated in the longitudinal direction thereof, and to provide a predetermined space between the lower casing 5 and the spacer 7 so as to cover the entirety of the wiring substrate 6-side of the lower casing 5.

The above structure allows the battery pack 2 to define one internal space located on the mobile information terminal 1-side, among the two internal spaces divided through the spacer 7, by the spacer 7 and the lower casing 5. This internal space defined by the spacer 7 and the lower casing 5 receives a secondary battery 8.

The secondary battery 8 used herein is a plate-shaped non-aqueous secondary battery whose cathode and anode are connected with metal plate-made terminals 8A and 8B respectively. Tip ends of the terminals 8A and 8B are designed to extend toward the upper casing 4 along the inner side of the terminals 6D of the wiring substrate 6.

Figure 3:
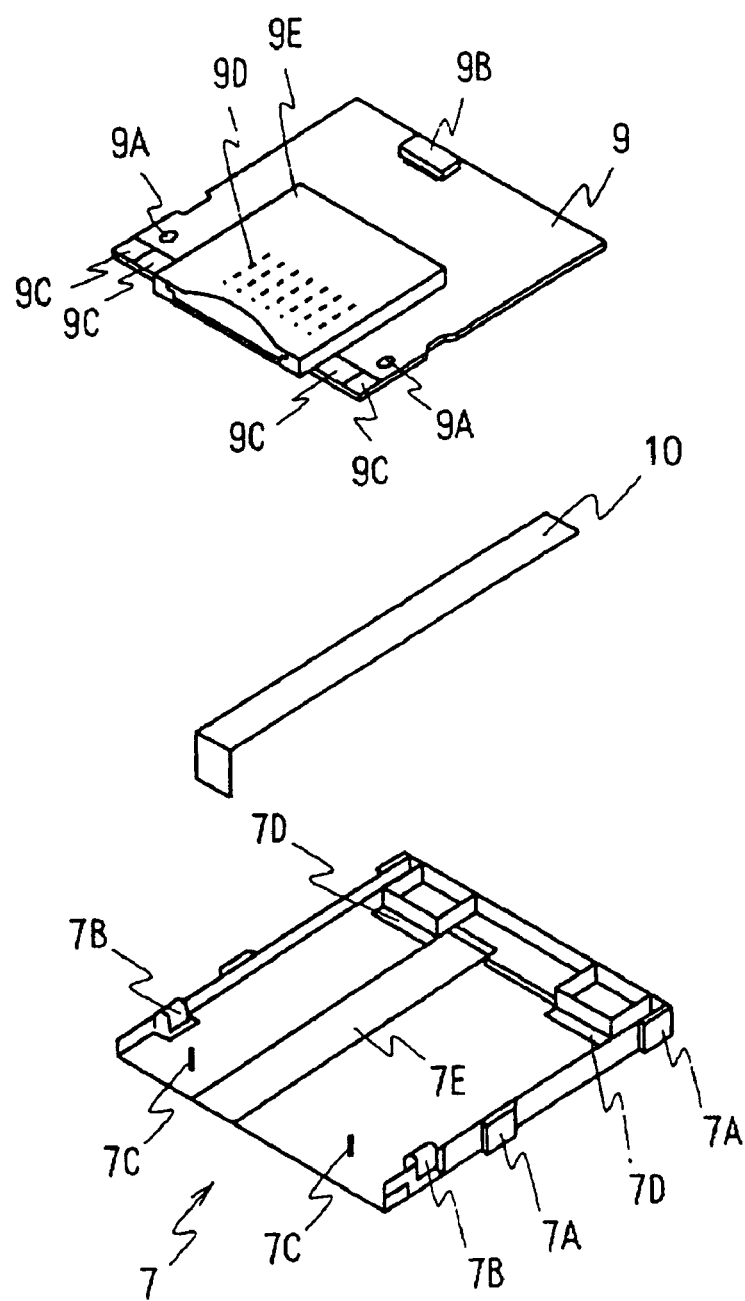
FIG. 3 is an exploded perspective view showing a spacer of the battery pack of FIG. 2 together with a peripheral configuration thereof.

Referring to FIG. 3 of an exploded perspective view showing the spacer 7 together with the peripheral configuration thereof, the spacer 7 also has an upper casing 4 side-face formed in a recess-shaped portion and is also designed to receive the wiring substrate 9 in the recess-shaped portion. The spacer 7 also has, on a wall surface thereof, claws 7B that protrude toward the inside thereof, so that the wiring substrate 9 is held by the claws 7 so as to be in close contact with the spacer 7. In addition, the spacer 7 has, on a bottom face thereof, substantially cylindrical-shaped projections 7C that protrude toward the upper casing 4, while the wiring substrate 9 has through holes 9A for receiving the projections 7C. This allows the spacer 7 to securely hold the wiring substrate 9 in place after the wiring substrate 9 is placed on the spacer 7 so as to press the projections 7C.

In addition, the spacer 7 also has, on an inner side thereof as seen from an opening 2A-side, plate-shaped projections 7D that are dislocated from a bottom face of the spacer 7 to an upper casing 4-side by a distance corresponding to a thickness of the wiring substrate 9. Thus, the projections 7D also allow the spacer 7 to hold the wiring substrate 9 in place so as to be in close contact with the bottom face thereof. Furthermore, the spacer 7 also has a recess section 7E for receiving the flexible wiring substrate 10. This allows the spacer 7 to hold the flexible wiring substrate 10 between the wiring substrate 9 and the bottom face of the spacer 7 so as to prevent the wiring substrate 9 from being lifted from the bottom face thereof, and also allows the flexible wiring substrate 10 to ensure that a sufficient insulation distance between the secondary battery 8 and the flexible wiring substrate 10 is provided by a thickness of the bottom face thereof.

The spacer 7 is also designed to have a minute space on the wiring substrate 6-side such that, when the wiring substrate 9 is placed on the lower casing 5, the terminals 6D, 8A and 8B of the wiring substrate 6 and the secondary battery 8 protrude toward the wiring substrate 9 or that one end of the flexible wiring substrate 10 received in the recess section 7E is bent enough to be connectable with the connector 6C of the wiring substrate 6.

The terminals 6D, 8A and 8B protruding toward the wiring substrate 9 are connected by soldering, after the wiring substrate 9 is placed on the spacer 7 together with the flexible wiring substrate 10. When the wiring substrate 9 is placed on the spacer 7, the other end of the flexible wiring substrate 10 is connected to the mounted connector 9B, and the flexible wiring substrate 10 connected to the connector 9B is also connected to the connector 6C of the wiring substrate 6. Incidentally, the wiring substrate 9 is designed such that a face thereof opposite to the spacer 7 serves as a component-mounting face relating to the surface mounting.

In other words, the wiring substrate 9 has connector 9B mounted on the component-mounting face thereof. In addition, the wiring substrate 9 working as the component-mounting face has, on a peripheral edge on a side from which the terminals 6D, 8A and 8B are protruding, lands 9C that correspond to the terminals 6D, 8A and 8B. This allows the terminals 6D, 8A and 8B protruding toward the wiring substrate 9 to be soldered onto the lands 9D so that the terminals 6D, 8A and 8B are bent at the lands 9C.

The wiring substrate 9 also has, on an inner portion thereof that corresponds to a portion of the opening 2A, terminals 9D that contact the terminal of the memory card 3. The wiring substrate 9 also has a shield housing 9E that covers the entirety of the memory card 3, when the memory card 3 is inserted into the opening 2A so as to be in contact with the terminals 9D.

Figure 4:
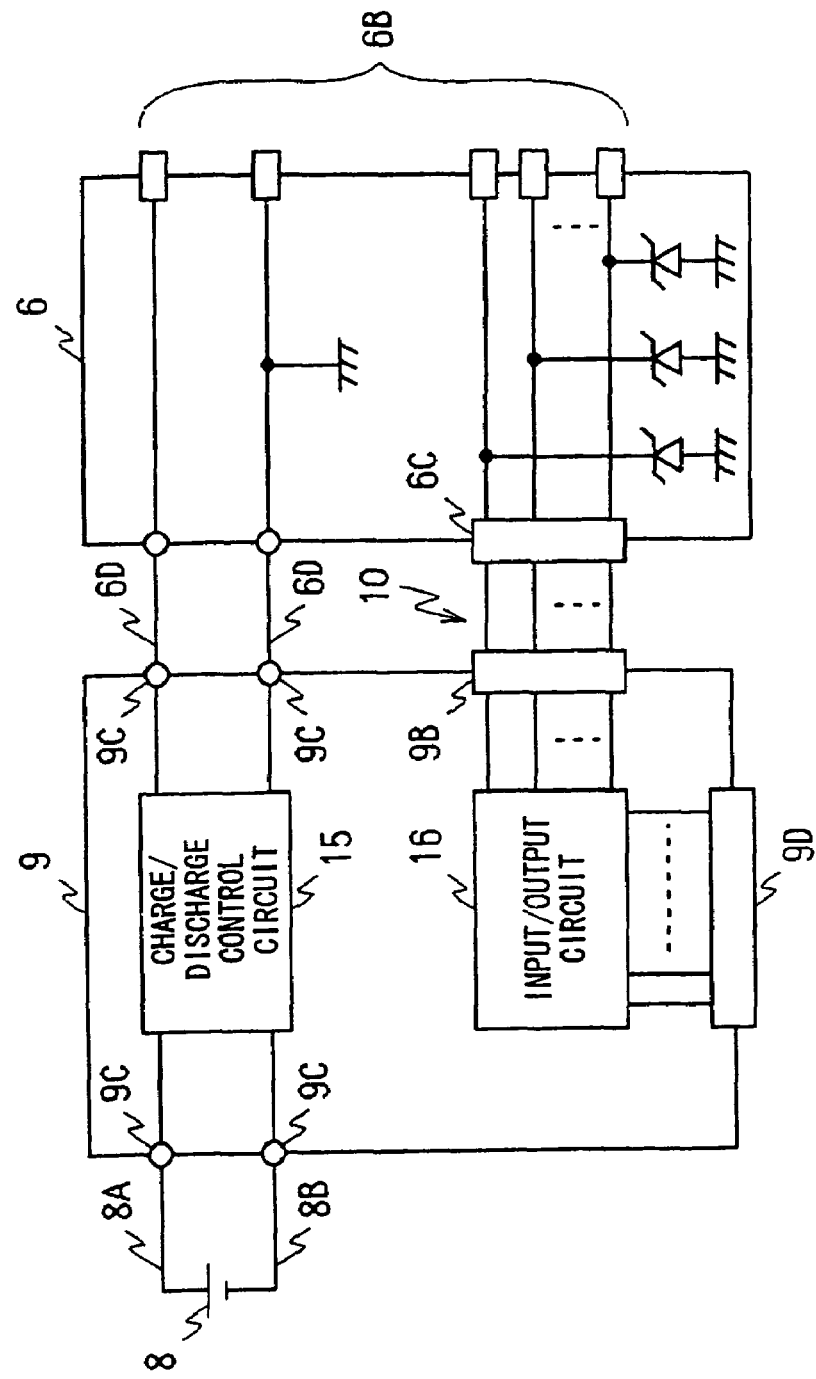
FIG. 4 is a block diagram showing a connection of the battery pack of FIG. 2.

The above structure allows the wiring substrate 9 to be connected with the secondary battery 8, the terminal 6B and the memory card 3, so that a charge/discharge control circuit 15 of the secondary battery 8 and an input/output circuit 16 of the memory card 3 are mounted on the wiring substrate 9, as shown in FIG. 4. During discharging, the charge/discharge control circuit 15 used herein monitors a current discharged by the secondary battery 8 so that an excessive current discharge caused by an accident such as a short-circuit may be prevented. During discharging, the charge/discharge circuit 15 also monitors a terminal voltage of the secondary battery 8 so that an excessive charging may be avoided. During charging, the charge/discharge control circuit 15 also monitors a charging current so that an abnormal charging or an excessive charging may be avoided. During charging/discharging, the charge/discharge circuit 15 also monitors a temperature of the secondary battery 8 so that an abnormal heat generation in the secondary battery 8 may be avoided.

On the other hand, the input/output circuit 16 monitors a potential of a predetermined one of the terminals 9D to detect when the memory card 3 is inserted into or detached from the battery pack 2 and also informs the mobile information terminal 1 about a result of detection. In addition, the input/output circuit 16 is also controlled by the mobile information terminal 1 through the flexible wiring substrate 10 so as to read out information stored in the memory card 3 to output the read information. Conversely, the input/output circuit 16 stores information obtained from the mobile information terminal 1 into the memory card 3.

The secondary battery 8 and the spacer 7 or the like are set up on the lower casing 5, after which the upper casing 4 is placed on the lower casing 5 so as to be fixed thereto by adhesion or the like. The upper casing 4 is formed by subjecting a resin material to an injection molding, in a similar way to the lower casing 5, such that the opening 2A for inserting the memory card 3 into the space defined by the shield housing 9E is provided in the upper casing 4. The side faces of the spacer 7 are provided to protrude toward the upper casing 4 when the spacer 7 is placed on the lower casing 5. The upper casing 4 is designed such that the side faces of the upper casing 4 collide against the side faces of the lower casing 5 and an inner side of the side faces of the upper casing 4 further collides against the protruded portions of the spacer 7.

The above structure allows the secondary battery 8 to be received in one internal space provided by the spacer 7 serving as the resin-formed body so as to output a power to the mobile information terminal 1, and also allows the wiring substrate 9 to be held in place by the spacer 7 serving as the resin-formed body in the other internal space provided by the spacer 7 so that the control circuit for controlling the supply of the power from the secondary battery 8 may be mounted on the wiring substrate 9, and not only the supply of the power from the secondary battery 8 but also a charging of the secondary battery 8 may be controlled.

In addition, the upper casing 4 and the lower casing 5 also allow the wiring substrate 6 serving as the relay wiring substrate having at least the terminal 6B for outputting the power of the secondary battery 8 to be held in place so as to be in close contact with the inner wall surfaces of the casings such that the terminal 6B is exposed to the outside of the upper and lower casings 4 and 5. The relay wiring substrate 6 is connected to the wiring substrate 9 through the flexible sheet-shaped wiring material 10 and the metal plate-made wiring material 6D. The secondary battery 8 thereby allows the terminal 6B to output the power through the wiring substrate 9, the metal plate-made wiring material 6D and the relay wiring substrate 6 in this order.

Figure 6:
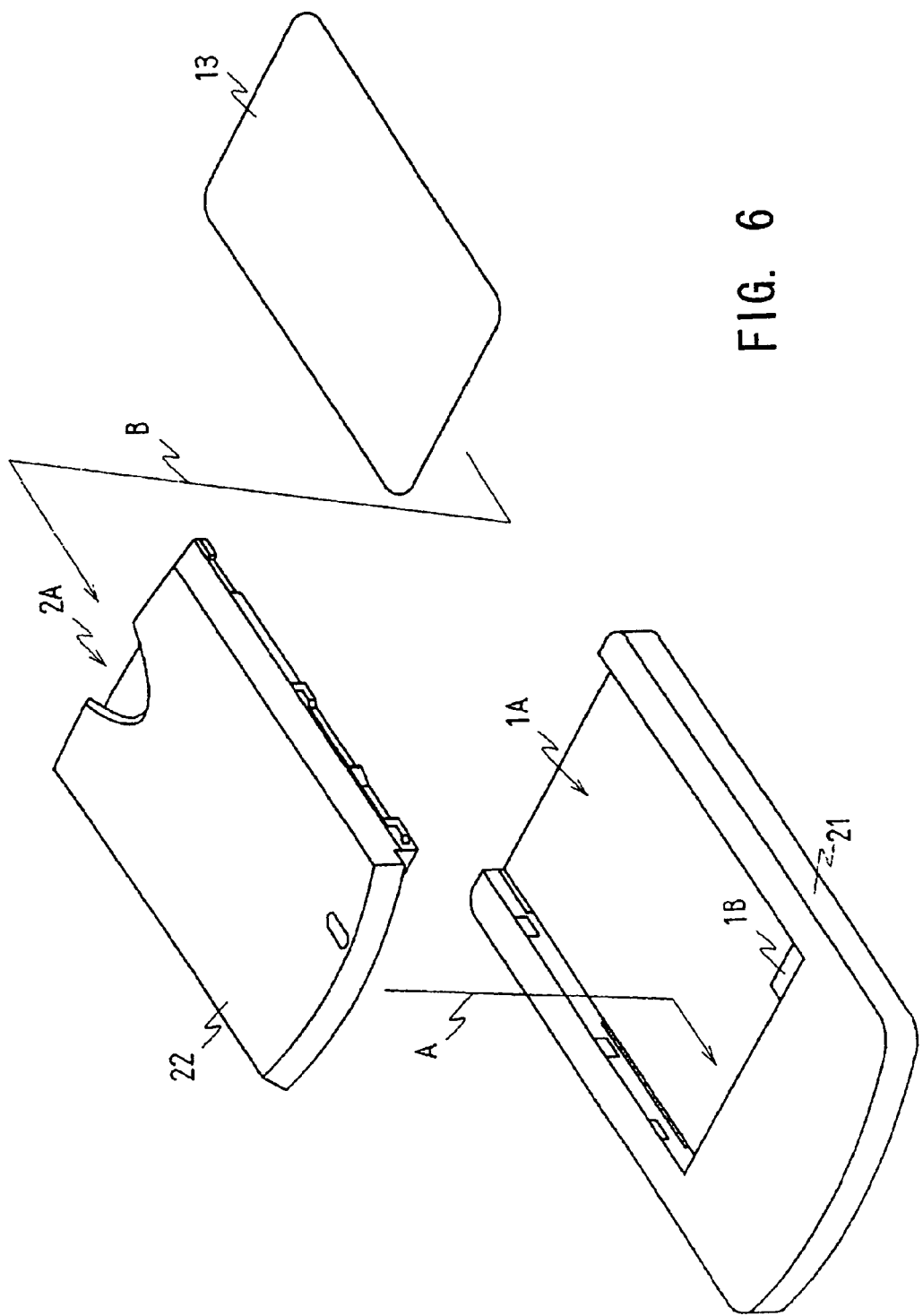
FIG. 6 is a perspective view showing the battery pack together with a mobile information terminal according to the second embodiment of the present invention.

A configuration of a battery pack according to a second embodiment of the present invention will now be described. FIG. 6 is a perspective view showing a mobile information terminal 21 according to the second embodiment of the present invention as seen from a back face side thereof. Incidentally, in FIG. 6, same reference numerals are provided to members having functions similar to those of the members according to the first embodiment of the present invention, and hence, a detailed description thereof will be omitted. The mobile information terminal 21 is a PDA, which has, on a surface thereof, a liquid crystal display panel, and which also has, on the surface or the like, various operators and interface. These operators and interface allow the mobile information terminal 21 to be connected to a personal computer or the like, for instance, so as to upload information stored in the personal computer for viewing, or to allow the mobile information terminal 21 to download various pieces of information stored therein to the personal computer.

The mobile information terminal 21 has, on a back face thereof, a recess section 1A for receiving a battery pack 22 detachably. The recess section 1A has, on a starting end part thereof, a connector 1B for receiving a power or the like of the battery pack 22. In addition, the recess section 1A also has, on side faces thereof, fixing pieces or the like for receiving and fixing the battery pack 22. This allows the mobile information terminal 21 to receive the battery pack 22 by sliding the battery pack 22 along the recess section 1A as shown by an arrow A in FIG. 6, thereby providing a driving power from a power supply of the battery pack 2 to the mobile information terminal 21. Alternatively, the battery pack 22 may be detached from the mobile information terminal 21 by sliding the battery pack 22 in the reverse direction.

The mobile information terminal 21 is designed to receive, through the battery pack 22, a cash card-shaped IC card 13 having a contact point on a back face thereof. For this reason, the mobile information terminal 21 is also designed such that various terminals such as a power supply terminal and terminals required for an access to the IC card 13 through the battery pack 22 are placed on the connector 1B.

In addition, the battery pack 22 is also designed to protrude from the back face of the mobile information terminal 21 while covering the recess section 1A when the battery pack 22 is received in the mobile information terminal 21. The battery pack 22 also has, on a side face thereof that corresponds to a lower end of the mobile information terminal 21, an opening 2A for inserting the IC card 13. The battery pack 22 also has, on an interior part of the opening 2A thereof, components such as a terminal for receiving the IC card 13 and an input/output circuit connected to the above terminal. This allows the mobile information terminal 21 to provide an access to the IC card 13 through the battery pack 22, when the IC card 13 is inserted into the opening 2A of the battery pack 22 as shown by an arrow B in FIG. 6 after the battery pack 22 is attached to the mobile information terminal 21.

Figure 5:
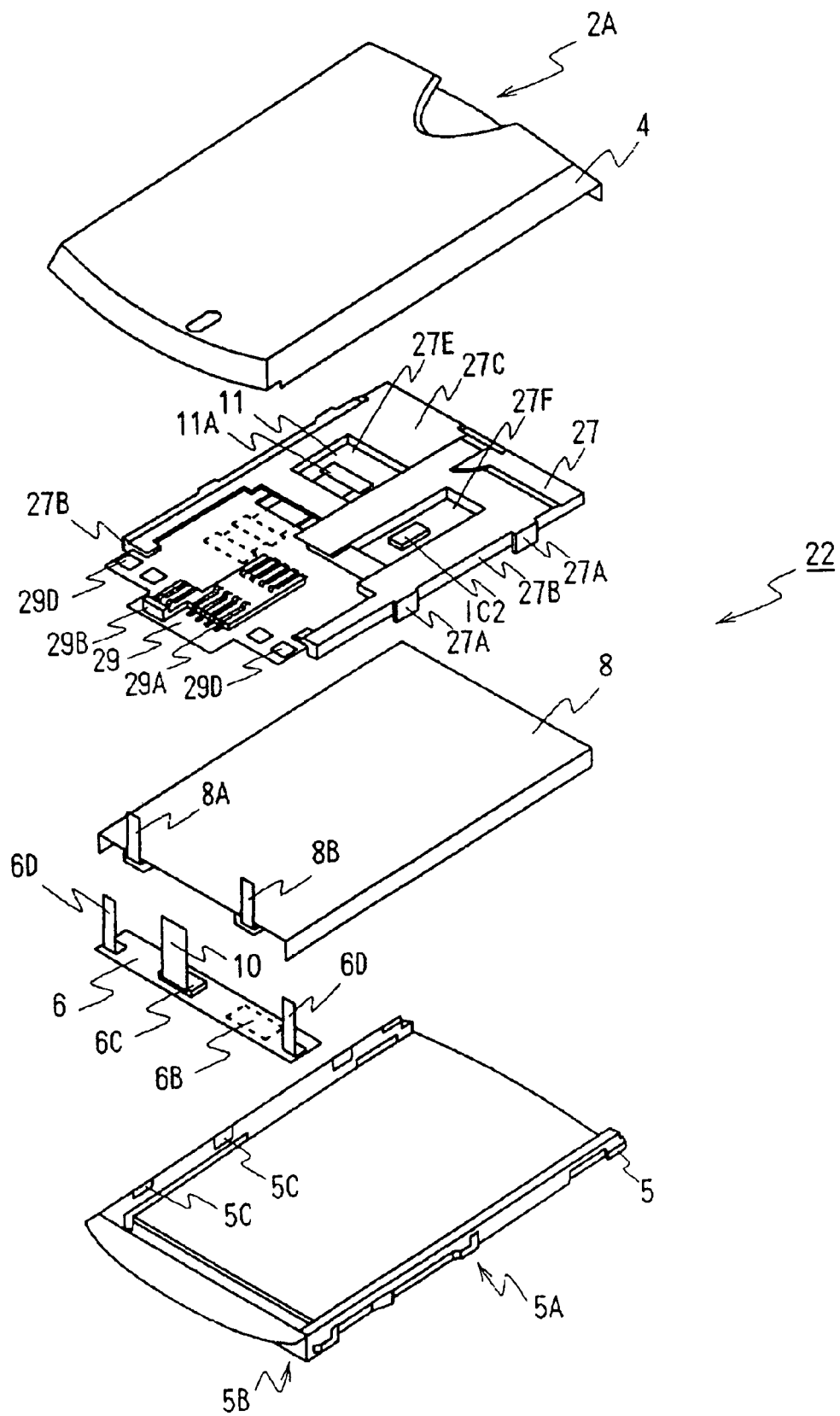
FIG. 5 is an exploded perspective view showing a battery pack according to a second embodiment of the present invention.

FIG. 5 is an exploded perspective view showing the battery pack 22. In FIG. 5, same reference numerals are provided to members having functions similar to those of the members according to the first embodiment of the present invention, as in a case of FIG. 6, and hence, a detailed description thereof will be omitted.

According to the second embodiment of the present invention, a spacer 27 is formed by subjecting a resin to an injection molding and is positioned by the recess sections 5C provided on the lower casing 5 so as to be held in place on an inner wall surface of the exterior housing composed of the upper casing 4 and the lower casing 5. In other words, the spacer 27 is placed on the lower casing 5 such that projecting sections 27A are provided on an outer wall surface so as to correspond to the recess sections 5C of the lower casing 5 and the recess sections 5C engage with the projecting sections 27A so as to prevent the battery pack 22 from being dislocated in the longitudinal direction thereof and to provide a predetermined space between the lower casing 5 and the spacer 27.

Figure 7:
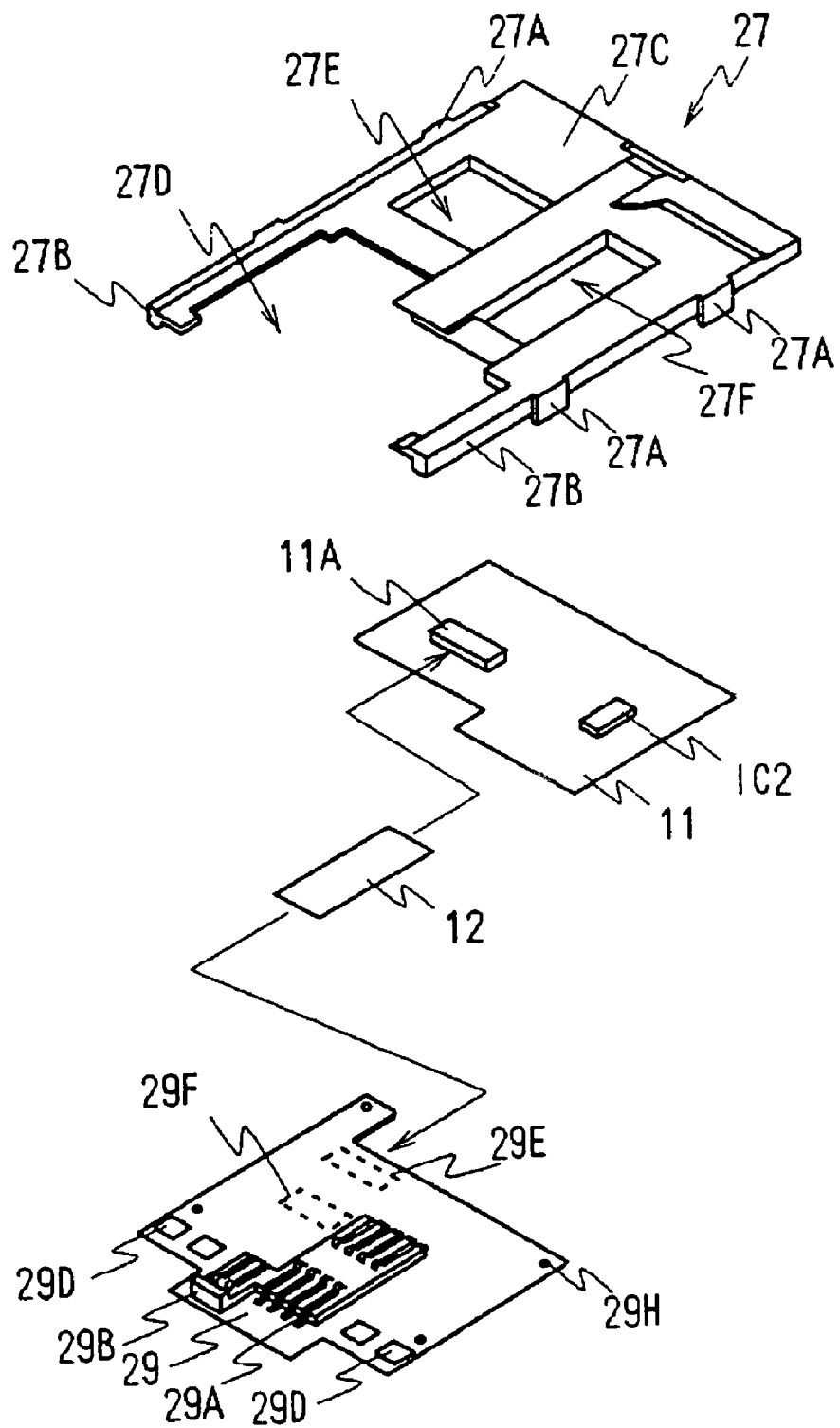
FIG. 7 is an exploded perspective view showing a spacer of the battery pack of FIG. 6 together with a peripheral configuration thereof.

Referring to FIG. 7, the spacer 27 has the projecting sections 27A, bar-shaped side plates 27B extending along the inner wall surface of the lower casing 5 and bottom plates 27C for connecting the side plates 27B with each other. The spacer 27 is designed such that a large notch 27D is provided on a portion on the bottom plates 27C ranging from a substantially middle portion in the longitudinal direction of the spacer 27 to an end of the spacer 27, to which the IC card 13 is inserted. In addition, the spacer 27 is also designed such that a portion thereof ranging from the substantially middle portion in the longitudinal direction of the spacer 27 to the end part thereof, to which the IC card 13 is inserted, has openings 27E and 27F, except for the center portion thereof. The openings 27E and 27F have a predetermined size and are provided in the bottom plates 27C on the opposite sides of the side plates 27B.

The spacer 27 is also designed such that, among portions other than the notch 27D and the openings 27E and 27F, the upper faces of the bottom plates 27C and the side plates 27B have the same height, except for one portion on the opening 27E-side and the other portion on the starting end of the opening 27F, thereby allowing the faces having the same height to guide the lower face of the IC card 13. The one portion on the opening 27E-side and the other portion on the starting end of the opening 27F, which do not serve as a guide for the IC card 13, are provided to be thinner in order to proportionally reduce the amount of resin material used, thereby preventing an increase of the overall weight of the spacer 27. This allows the battery pack 22 to ensure a secure guide of the lower face of the IC card 13 enabled by the side plates 27B that correspond to the opposite ends of the IC card 13 and a portion on the middle of the side plates 27B for receiving the IC card 13. This provides a secure guide of the IC card 13.

As described above, in the spacer 27, the bottom plates 27C having the openings 27E and 27F and the notch 27D have, on a face thereof on the secondary battery 8-side, a first wiring substrate 29 and a second wiring substrate 11, which are placed along the secondary battery 8. These first and second wiring substrates 29 and 11 are connected with each other through a flexible wiring substrate 12, and a face of the wiring substrate 29 on the wiring substrate 29-side is connected with the wiring substrate 6 through the flexible wiring substrate 10. Among the wiring substrates 29 and 11, the wiring substrate 29 is on the side to which the IC card 13 is inserted and thus has a connector 29A connected to a terminal of the IC card 13 and a switch 29B for detecting an insertion of the IC card 13.

A thickness of the bottom plate 29C is determined so as to ensure a secure operation of the connector 29A and the switch 29B when the IC card 13 is inserted into the battery pack 22.

The spacer 27 is also designed to have a minute space on the wiring substrate 6-side so that, when the wiring substrate 29 or the like is placed on the lower casing 5, the terminals 6D, 8A and 8B of the wiring substrate 6 and the secondary battery 8 protrude toward the wiring substrate 29. The terminals 6D, 8A and 8B protruding from the space of the spacer 27 are soldered onto the wiring substrate 29.

In other words, the opposite surfaces of the wiring substrate 29 are designed to serve as mounting faces that provide surface mounting. The wiring substrate 29 is also designed such that through holes 29H provided in the periphery thereof allow the wiring substrate 29 to be placed on the bottom plate of the spacer 27 on the secondary battery 8-side. In this way, the wiring substrate 29 is provided on the spacer 27 so that the connector 29A and the switch 29B are placed on the IC card 13-side face thereof. Among the connector 29A and the switch 29B, the switch 29B also serves as a stopper to the IC card 13 that switches the contact point of the IC card 13 to an on-state when the IC card 13 is inserted into the battery pack 22. On the other hand, the connector 29A is designed to, when the IC card 13 is inserted into the battery pack 22, have a contact with the contact point of the IC card 13 until the switch 29B is switched into the on-state as described above.

The wiring substrate 29 also has, on a peripheral edge of the component-packaging face thereof, lands 29D that correspond to the terminals 6D, 8A and 8B. This allows the terminals 6D, 8A and 8B protruding toward the wiring substrate 29 to be soldered onto the lands 29D so that the terminals 6D, 8A and 8B are bent at the lands 29D.

Figure 8:
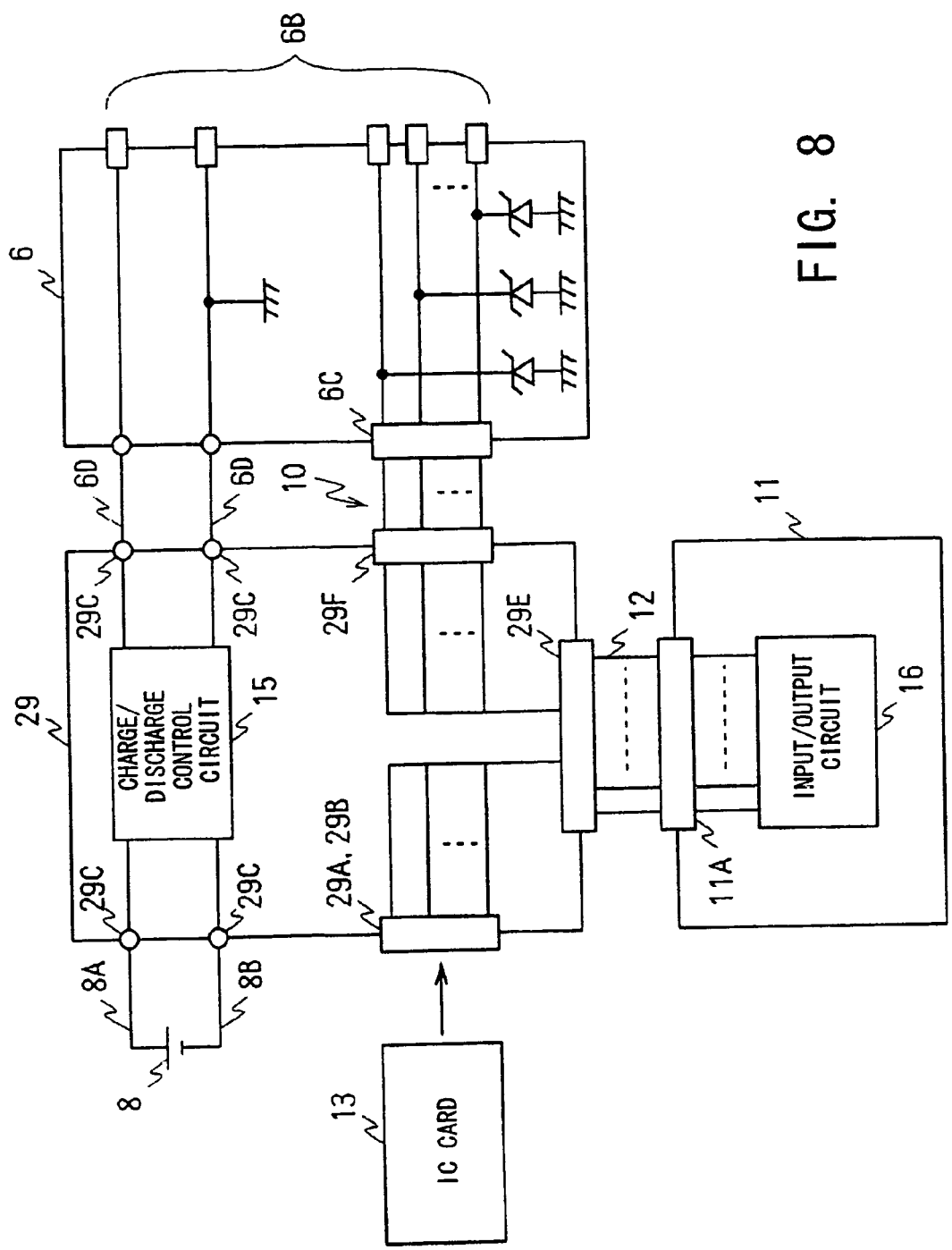
FIG. 8 is a block diagram showing a connection of the battery pack of FIG. 6.

The wiring substrate 29 also has the other mounting face on the secondary battery 8-side. This mounting face has mounted components other than the above mounted components, thereby allowing the above mounted components so as not to hinder the insertion of the IC card 13. The components mounted on the secondary battery 8-side of the wiring substrate 29 include, as shown in FIG. 8, a charge/discharge control circuit 15 for controlling charging/discharging of the secondary battery 8, a connector 29E of the flexible wiring substrate 12 used for a connection with the wiring substrate 11 and a connector 29F of the flexible wiring substrate 10 used for a connection with the wiring substrate 6.

During discharging, the charge/discharge control circuit 15 monitors a current discharged by the secondary battery 8 so that an excessive current discharge caused by an accident such as a short-circuit may be prevented. During discharging, the charge/discharge control circuit 15 also monitors a terminal voltage of the secondary battery 8 so that an excessive current discharge from the secondary battery 8 may be avoided. During charging, the charge/discharge control circuit 15 monitors a charging current so that an abnormal charging or an excessive charging may be avoided. During charging/discharging, the charge/discharge control circuit 15 also monitors a temperature of the secondary battery 8 so that an abnormal heat generation in the secondary battery 8 may be avoided.

Figure 9:
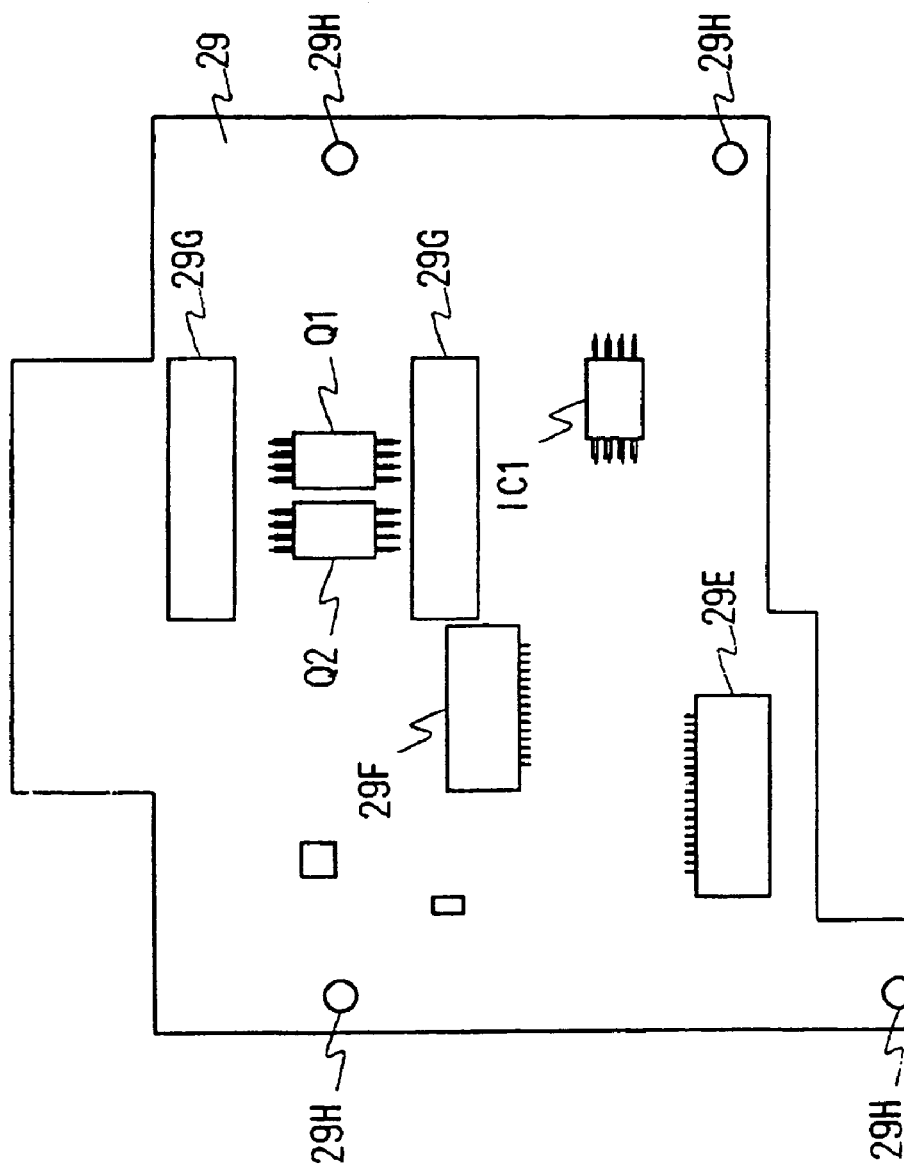
FIG. 9 is a plan view showing a secondary battery side-face of a first wiring substrate.

As may be seen from FIG. 9 when seeing the wiring substrate 29 from the back face thereof, the charge/discharge control circuit 15 packaged on the wiring substrate 29 has an integrated circuit IC1 of a rectangular-shaped resin package and transistors Q1 and Q2 of similar resin packages. Upper end faces of the three packages of the integrated circuit IC1 and the transistors Q1 and Q2 are provided so as to have a substantial contact with the spacer 27 side-face of the secondary battery 8, allowing the charge/discharge control circuit 15 to rapidly detect a temperature change of the secondary battery 8 so as to ensure a secure charge/discharge control.

In this way, the wiring substrate 29 is designed such that the transistors Q1 and Q2 packaged on the secondary battery 8 side-face thereof are in line with each other, with spacers 29G adhered to the component-mounting face so as to sandwich the transistors Q1 and Q2. These spacers 29G are provided such that their height from the component-mounting face becomes substantially equal to those of the upper end faces of the packages of the transistors Q1 and Q2, so that the wiring substrate 29 is placed in close vicinity of the secondary battery 8, thereby effectively avoiding accidents such as a disconnection and the short-circuit, which are caused when the spacer 27 is bent due to an impact or the like, by reducing the impact on the transistors Q1 and Q2 and the integrated circuit IC1.

The wiring substrate 29 is designed such that the anode and the cathode of the secondary battery 8 are connected with the charge/discharge control circuit 15 through the lands 29D and the charging/discharging control circuit 15 is connected with the wiring substrate 29 through the lands 29D, thereby supplying the power to the mobile information terminal 21 and also charging the secondary battery 8.

The wiring substrate 29 is also designed such that output of the contact point of the switch 29B and each terminal of the connector 29A are introduced to the wiring substrate 11 through the connector 29E and the flexible wiring substrate 12. Input and output of the wiring substrate 11 are further introduced to the wiring substrate 29 sequentially through the flexible wiring substrate 12 and the connector 29E and are then connected to the wiring substrate 6 through the connector 29F and the flexible wiring substrate 10.

The input/output circuit 16 monitors the contact point of the switch 29B to detect when the IC card 13 is inserted or detached from the battery pack 22, thereby information of a result of detection. The input/output circuit 16 is also controlled by the mobile information terminal 21 through the wiring substrate 29 and the flexible wiring substrate 12 so as to read out information stored in the IC card 13 to output the read information. Conversely, the input/output circuit 16 stores information obtained from the mobile information terminal 21 into the IC card 13.

The wiring substrate 11 has the input/output circuit 16 formed by an integrated circuit IC2 (FIG. 7) of a rectangular-shaped resin package. The wiring substrate 11 is placed on the secondary battery 8 side-face of the spacer 27, as in a case of the wiring substrate 29. The wiring substrate 11 is designed such that one surface thereof on the spacer 27-side serves as the component-mounting face providing the surface mounting so as to provide thereon a connector 11A corresponding to the opening 27E of the spacer 27, while a portion thereon corresponding to the opening 27F has the integrated circuit IC2. This allows the wiring substrate 11 to effectively utilize the openings of the spacer 27 to sufficiently secure a space for receiving the secondary battery 8.

Incidentally, the above configuration of the wiring substrates 29 and 11, however, causes a possibility where the back face of the wiring substrate 11 has a close contact with the secondary battery 8 although the wiring substrate 29 may ensure a sufficient insulation distance to the secondary battery 8, thereby preventing the wiring substrate 11 from having the sufficient insulation distance as compared with the wiring substrate 29. To avoid the above possibility, the secondary battery 8 is covered with the exterior housing for insulation, and the back face of the wiring substrate 11 is provided with an insulation layer, thereby providing insulation between the secondary battery 8 and the wiring substrate 11. Alternatively, merely separating the wiring substrate 29 from the wiring substrate 11 may ensure a sufficient reliability even if the wiring substrate 11 is in the vicinity of the secondary battery 8, because of a difference in function between the wiring substrate 29 and the wiring substrate 11, in other words, the wiring substrate 29 is to mount thereon circuit components for the charge/discharge control of the secondary battery 8 having a high energy density, while the wiring substrate 11 serves as an interface for input/output of the IC card 13.

The secondary battery 8 and the spacer 27 or the like are set up on the lower casing 5, after which the upper casing 4 is placed on the lower casing 5 so as to be fixed thereto by adhesion or the like. The upper casing 4 is formed by subjecting a resin material to an injection molding in a similar way to the lower casing 5. The inner wall surfaces of the upper casing 4 guide the side faces of the IC card 13 and have the opening 2A for inserting the IC card 13. The spacer 27 is placed on the lower casing 5, after which the side faces of the spacer 27 are provided so as to protrude toward the upper casing 4. The upper casing 4 is also designed such that the side faces of the upper casing 4 collide against the side faces of the lower casing 5 and the inner side of the side faces of the upper casing 4 further collides against the protruded portions of the spacer 27.

An operation of the battery packs 2 and 22 according to the first and second embodiments of the present invention will now be described.

In the configuration of the battery pack 2 according to the first embodiment of the present invention as described above, the battery pack 2 shown in FIG. 2 is placed on the back face of the mobile information terminal 1 to serve as a power supply, thereby providing the driving force to the mobile information terminal 1. The battery pack 2 also serves as an interface for the mobile information terminal 1, which connects the mobile information terminal 1 to the charger, while being attached to the mobile information terminal 1, and which may be detached from the mobile information terminal 1 to be connected with the charger, thereby receiving a charge by a power supply of the charger. The battery pack 2 also serves as an interface, which is placed on the back face of the mobile information terminal 1 to receive the memory card 3 inserted through the opening 2A and to support the memory card 3 detached from the opening 2A, thereby informing the mobile information terminal 1 about the insertion or detachment of the memory card 3. The battery pack 2 also serves as an interface, which receives the memory card 3 to support the operation of the mobile information terminal 1 by a user, thereby storing, in the memory card 3, various pieces of information stored in the mobile information terminal 1 or conversely allowing the mobile information terminal 1 to have an access to the information stored in the memory card 3. Thus, the first embodiment of the present invention allows the battery pack 2 to serve also as the interface for the IC card 3 so that there may be provided a proportional increase of the number of apparatuses connectable to the mobile information terminal 1, thereby increasing a usability of the mobile information terminal 1.

The battery pack 2 is received in the recess section 1A of the mobile information terminal 1 and, when being attached to the mobile information terminal 1, protrudes from the back face of the mobile information terminal 1. The side face above the protruded portion has the opening 2A for inserting the memory card 3. The protruded portion also has the input/output circuit 16 (FIG. 4) of the memory card 3 and the charge/discharge control circuit 15 of the secondary battery 8.

In other words, the battery pack 2 (FIG. 3) has the wiring substrate 9 having, thereon, the mounted components such as the input/output circuit 16, the charge/discharge control circuit 15, the shield housing 9E and the terminals 9D, and one end of the flexible wiring substrate 10 is connected to the connector 9B. In addition, the flexible wiring substrate 10 is bent at the back side of the wiring substrate 9 such that the wiring substrate 9 is placed in the spacer 7 made of the resin material so as to sandwich the flexible wiring substrate 10 between the wiring substrate 9 and the spacer 7. The battery pack 2 also has the spacer 7 having the recess section 7E corresponding to the thickness of the flexible wiring substrate 10, and the wiring substrate 9 is designed such that the face opposite to the spacer 7-side serves as the component-mounting face. This allows the battery pack 2 to hold the wiring substrate 9 in place such that the bottom face thereof is in close contact with the bottom face of the spacer 7, also to hold the flexible wiring substrate 10 and the wiring substrate 9 in place such that the thickness of the spacer 7 provides securely a sufficient insulation to the secondary battery 8 received in the internal space on the lower side of the spacer 7, and further to hold the flexible wiring substrate 10 in place so as not to be dislocated due to vibrations or the like.

The spacer 7 also has the projections 7D on the starting end side, the projections 7C corresponding to the through holes 9A and the craws 7B, so that the wiring substrate 9 may be positioned on the spacer 7 and also be held in place such that the back face of the wiring substrate 9 has a close contact with the bottom face of the spacer 7.

The battery pack 2 is assembled as follows. That is, the connector providing the connection between the battery pack 2 and the mobile information terminal 1 and the wiring substrate 6 providing the relay substrate between the wiring substrate 6 and the wiring substrate 9 are set up on the lower casing 5 (FIG. 1), after which the secondary battery 8 is placed on the lower casing 5. Following the secondary battery 8, the spacer 7 having various components as described above is also placed on the lower casing 5. Further, the terminals 6D, 8A and 8B of the wiring substrate 6 and the secondary battery 8 are bent, and these bent portions are soldered onto the wiring substrate 9, after which the upper surface of the lower casing 5 is covered with the upper casing 4, thereby providing the battery pack 2.

The battery pack 2 allows the spacer 7 serving as the plate-shaped insulating material to divide the internal space defined by the exterior housing composed of the upper casing 4 and the lower casing 5 into two spaces in the thickness direction so that the secondary battery 8 is received in the internal space on the lower side, while the wiring substrate 9 having, thereon, the mounted components such as the charge/discharge circuit 15 and the input/output circuit 16 is placed in the internal space on the upper side so as to be substantially insulated from the secondary battery 8. In addition, the internal space defined by the exterior housing is divided into two spaces through the spacer 7 as described above, thereby allowing the spacer 7 to hold the wiring substrate 9 so as to provide no dislocation in the longitudinal direction of the battery pack 2 by using the projections 7A provided on the side faces of the spacer 7 or to provide no dislocation in the thickness direction by the presence of the upper casing 4 and the lower casing 5. The two internal spaces provided by dividing the internal space defined by the exterior housing in the thickness direction allows the wiring substrate 9 to have a sufficient mounting space, so that various interfaces or the like may be mounted on the wiring substrate 9 when the wiring substrate 9 is applied to various other uses. Thus, the first embodiment of the present invention allows the battery pack 2 to have the input/output circuit 16 of the memory card 3, the connection terminals 9D, the shield housing 9E or the like, which may be mounted on the wiring substrate 9. Accordingly, the first embodiment of the present invention also allows the wiring substrate 9 to hold the input/output circuit 16 or the like of the memory card 3 securely in the limited space in the battery pack 2, while ensuring that the sufficient insulation is provided to the battery.

In the configuration of the battery pack 22 according to the second embodiment of the present invention, the battery pack 22 shown in FIG. 6 is placed on the back face of the mobile information terminal 21 to serve as a power supply that provides the driving force to the mobile information terminal 21. The battery pack 22 also serves as the interface for the mobile information terminal 21, which connects the mobile information terminal 21 to the charger, while being attached to the mobile information terminal 21, and also which may be detached from the mobile information terminal 21 to be connected with the charger, thereby receiving a charge from the power supply of the charger. The battery pack 22 also serves as the interface, which is placed on the back face of the mobile information terminal 21 to receive the IC card 13 inserted through the opening 2A and to support the IC card 13 detached from the opening 2A, thereby informing the mobile information terminal 21 about the insertion or the detachment of the IC card 13. The battery pack 22 also serves as the interface, which receives the IC card 13 to support the operation of the mobile information terminal 21 by a user, thereby storing, in the IC card 13, various pieces of information stored in the mobile information terminal 21 or conversely allowing the mobile information terminal 21 to have an access to the information stored in the IC card 13. Thus, the second embodiment of the present invention allows the battery pack 22 to serve also as the interface for the IC card 13, so that there may be provided a proportional increase of the number of apparatuses connectable with the mobile information terminal 21, thereby increasing a usability of the mobile information terminal 21.

The battery pack 22 is received in the recess section 1A of the mobile information terminal 21 and, when being attached to the mobile information terminal 21, protrudes from the back face of the mobile information terminal 21. A side face below the protruded portion has the opening 2A for inserting the IC card 13. The protruded portion also has the input/output circuit 16 (FIG. 8) of the IC card 13 and the charge/discharge control circuit 15 of the secondary battery 8.

In other words, the battery pack 22 (FIG. 7) has the wiring substrate 29 having, thereon, the mounted components such as the charge/discharge control circuit 15, the connector 29A and the switch 29B. The battery pack 22 also has the wiring substrate 11 having, thereon, the mounted components such as the input/output circuit 16 and the connector 11A. The wiring substrates 29 and 11 are connected with each other through the flexible wiring substrate 12 to be placed on the spacer 27. Further, following the wiring substrate 6 having the terminals 6D, the connector 6C and the flexible wiring substrate 10 or the like, the secondary battery 8 is placed on the lower casing 5, after which the wiring substrates 6 and 29 are connected with each other through the flexible wiring substrate 10, and the spacer 27 is then also placed on the lower casing 5. Then, the terminals 6D, 8A and 8B are bent and the bent portions are soldered onto the lands 29D, after which the upper casing 4 placed on the lower casing 5.

In this way, the battery pack 22 has, along the secondary battery 8, the first wiring substrate 29 having the electronic components surface-mounted on the secondary battery 8 side-face thereof to constitute the charge/discharge control circuit, and the second wiring substrate 11 having the electronic components surface-mounted on the opposite surface to the secondary battery 8 side-face of the first wiring substrate 29 while having no surface-mounted electronic component on the secondary battery side-face thereof.

The above configuration allows the electronic components constituting the charge/discharge control circuit mounted on the first wiring substrate 29 to be in close vicinity of the secondary battery 8 so as to be substantially in close contact therewith, thereby providing an increased thermal coupling between the electronic components and the secondary battery 8. This also allows the charge/discharge control circuit in the battery pack 22 to sensitively respond to a temperature change of the secondary battery 8 to increase an accuracy of various temperature characteristic-related controls. Specifically, the above configuration allows a full charging capacity, a discharging capacity or the like, which vary depending on a temperature, to be controlled with an increased accuracy so that the full charging capacity may be appropriately controlled and an excessive discharging may be avoided. The above configuration also allows a rapid temperature change of the secondary battery 8 to be appropriately controlled, thereby providing a fast response to an accident or the like.

The above configuration also allows the first wiring substrate 29 to have the resin-molded integrated circuit and the transistors which are surface-mounted on the secondary battery 8 side-face of the first wiring substrate 29, thereby ensuring the sufficient insulation distance among the soldered parts, the lands 29D and wiring patterns on the wiring substrate 29 even when the electronic components are in contact with the secondary battery 8. This ensures a sufficient reliability of the battery pack of the present invention.

On the other hand, the second wiring substrate 11 is placed along the secondary battery 8 together with the first wiring substrate 29, thereby ensuring a sufficient area. The second wiring substrate 11 has one surface on the secondary battery 8 side-face on which no electronic component is mounted, so that an insulation processing is provided on the secondary battery 8 side-face of the wiring substrate 11. This allows the input/output circuit 16 of the IC card 13 to be mounted on the wiring substrate 11 so as to ensure the sufficient insulation, thereby providing a sufficient reliability of the battery pack of the present invention.

In this way, an increase of the thickness of the battery pack may be effectively avoided, thereby allowing the battery pack of the present invention to serve also as the interface for the IC card 13.

In this way, the second wiring substrate 11 having the electronic components packaged thereon has the opening on a portion thereof which corresponds to the spacer 27, thereby providing a proportional reduction of the thickness of the battery pack 22 of the present invention.

In the first and second embodiments described above, the configuration in which the present invention is applied to the battery pack including the non-aqueous secondary battery has been described. However, the present invention is not limited to the above configuration, and it is to be understood that the present invention is also applicable to other configurations in which battery packs including various secondary batteries or battery packs including those batteries which are difficult to be charged are used.

In addition, the above first and second embodiments have also described the configuration in which the present invention is used for the battery for the PDA. However, the present invention is not limited to the above configuration, and it is to be understood that the present invention is also applicable to other configurations in which battery packs for various mobile information terminals such as mobile phones or battery packs for various video or audio apparatuses are used.

In addition, the above first embodiment has also described the configuration in which the battery pack provides the interface between the memory card and the battery pack. However, the present invention is not limited to the above configuration, and it is to be understood that the present invention is also applicable to other configurations in which battery packs provide interfaces between various apparatuses and the battery pack.

In addition, the above second embodiment has also described the configuration in which the first wiring substrate has the switch for detecting the insertion of the IC card and the connector. However, the present invention is not limited to the above configuration, and it is to be understood that the present invention is also applicable to other configurations in which the opening for inserting the IC card is provided on the opposite surface or the insertion of the IC card is made in the opposite direction, thereby allowing the second wiring substrate to have the switch and the connector.

The above second embodiment has also described the configuration in which the input/output circuit of the IC card is provided on the second wiring substrate. However, the present invention is not limited to the above configuration, and it is to be understood that the present invention is also applicable to other configurations in which an interface using a post stamp-sized memory card or an interface for infrared communications is used.

What is claimed is:

1. A battery pack attached to an electronic apparatus for supplying a power thereto, comprising:
    a battery for outputting said power;
    a resin-formed body laminated together with said battery to be held by said battery; and
    an exterior housing for holding said battery and said resin-formed body;
    wherein said resin-formed body holds, along said battery, a first wiring substrate having electronic components surface-mounted on a battery side-face thereof and a second wiring substrate having electronic components surface-mounted on the opposite face to the battery side-face of said first wiring substrate while having no surface-mounted electronic component on a battery side-face thereof; and
    said electronic components surface-mounted on said first wiring substrate include a control circuit for controlling the power of said battery.

2. The battery pack according to claim 1, wherein said first wiring substrate is connected to said second wiring substrate, and said second wiring substrate is connected to said electronic apparatus in a portion of said exterior housing in which a terminal for outputting the power is provided.

3. The battery pack according to claim 1, wherein said second wiring substrate is connected to said electronic apparatus through said first wiring substrate.

4. The battery pack according to claim 1, wherein said resin-formed body has openings on portions that correspond to the electronic components mounted on said second wiring substrate.

5. The battery pack according to claim 1, wherein said electronic components surface-mounted on said second wiring substrate configure an input/output circuit between an external apparatus and the battery pack.

6. The battery pack according to claim 5, wherein said external apparatus is a cash card-shaped IC card, and said exterior housing and said resin-formed body have a space for receiving said IC card, said space being formed on the opposite side to the battery side thereof.

7. The battery pack according to claim 1, wherein said battery is a non-aqueous secondary battery, and said control circuit not only controls the supply of said power from said battery but also controls a charging of said battery.

* * * * *